United States Patent [19]

Krimm et al.

[11] Patent Number: 4,743,848
[45] Date of Patent: May 10, 1988

[54] METHOD OF TESTING A STEPPING MOTOR

[75] Inventors: David L. Krimm; William R. Yount, both of Lexington; James O. Stidham, deceased, late of Winchester, all of Ky., by G. Wayne Littrell, executor

[73] Assignee: International Business Machines Corporation, Armonk, N.Y.

[21] Appl. No.: 886,506

[22] Filed: Jul. 17, 1986

[51] Int. Cl.[4] .............................................. G01R 31/02
[52] U.S. Cl. .............................. 324/158 MG; 318/696; 318/490
[58] Field of Search ................ 324/158 MG; 318/490, 318/696, 331, 375, 430, 439

[56] References Cited

U.S. PATENT DOCUMENTS 3,942,111  3/1976  Pfouts ...................... 324/158 MG
4,422,040  12/1983  Raider et al. ............ 324/158 MG X Primary Examiner—Reinhard J. Eisenzopf
Assistant Examiner—Vinh P. Nguyen
Attorney, Agent, or Firm—Frank C. Leach, Jr.; John A. Brady

[57] ABSTRACT

A three-phase stepping motor is automatically tested for excessive friction and winding shorts in less than four seconds. The stepping motor accelerates its rotor at a constant rate to a first predetermined velocity. The level of the current applied to the rotor windings to effect commutation is very low so that the rotor will stop and fail to complete any further steps in the test cycle if there is excessive binding or friction. After the rotor is rotated one revolution, it is accelerated at a constant rate to a second and higher predetermined velocity with the current applied to the rotor windings being increased to a second and higher level at a selected velocity during acceleration. When the rotor reaches the second predetermined velocity, commutation is stopped immediately but current is still applied to at least one phase of the motor. An acceptable motor will continue to turn and generate an AC back electromotive force (EMF) signal in the energized phase of the windings. A motor, which has excessive friction or a winding short, will not produce an AC back EMF signal because it will not be moving. With an acceptable motor, the elapsed time between stopping the application of current to the rotor windings to stop acceleration and when the rotor coasts to a stop is displayed and enables comparison of the degrees of friction between acceptable motors.

20 Claims, 8 Drawing Sheets

METHOD OF TESTING A STEPPING MOTOR

FIELD OF THE INVENTION

This invention relates to a method of automatically testing a stepping motor, also referred to as a synchronous motor, for excessive friction and winding shorts in a relatively short period of time and, more particularly, to a method of automatically testing a stepping motor for excessive friction and winding shorts without applying any mechanical connection to the rotor shaft to power the rotor shaft.

BACKGROUND OF THE INVENTION

U.S. Pat. No. 4,422,040 to Raider et al, which is incorporated by reference herein, discloses a method of quickly testing a stepping motor. The aforesaid Raider et al patent provides a satisfactory test method but requires a mechanical connection to the rotor shaft and uses relatively powerful currents.

The method of the aforesaid Raider et al patent is not capable of automatically detecting sources of internal drag such as interference between the rotor and stator of the stepping motor or high roller bearing friction. The roller bearings rotatably support opposite ends of the rotor shaft in the stator.

One means for testing a stepping motor for excessive friction has been to manually rotate the rotor shaft and have a person determine, by hand feel feedback, as to whether there is excessive friction. This is not satisfactory since the person may either pass defective motors or reject too many acceptable motors since the determination is dependent upon the subjective feel in the person's hand.

This manual testing also requires a relatively long period of time. The manual testing also must be accomplished at a different time than when there is testing of the motor for shorts such as in the aforesaid Raider et al patent, for example. Thus, manual testing for excessive friction not only lacks uniformity but also increases the time and cost of testing.

While the method of the aforesaid Raider et al patent satisfactorily performs tests of most of the important performance parameters of a stepping motor, it cannot reliably detect phase-to-phase and phase-to-ground short circuits. Therefore, in addition to not being able to automatically test a stepping motor for excessive friction, the method of the aforesaid Raider et al patent also cannot recognize certain short circuits.

SUMMARY OF THE INVENTION

The method of the present invention automatically tests a stepping motor for both excessive friction and winding shorts in a very short period of time such as less than four seconds, for example. Thus, the test method of the present invention eliminates the subjective testing by the person conducting the test as to whether there is excessive friction and accomplishes this without any mechanical connection to the rotor shaft. This absence of the need to mechanically connect and disconnect a motive source significantly decreases the test time.

The method of the present invention also automatically determines during the same short time period whether there is a short in any winding of the stator. With this capability of reliably detecting phase-to-phase and phase-to-ground short circuits in the motor along with determining whether there is excessive friction, an acceptable stepping motor is not inspected by any subjective testing.

Furthermore, the test method of the present invention and the test method of the aforesaid Raider et al patent jointly produce motors that will have less possibility of failure. While the test method of the present invention and the test method of the aforesaid Raider et al patent would be performed separately since the test method of the Raider et al patent requires the rotor shaft of the motor to be grasped by a power source and rotated, they could be disposed adjacent each other along a production line. The test method of the present invention would preferably be performed first because it would eliminate any rotor having excessive friction so as to reduce the total test time because the test method of the aforesaid Raider et al patent requires the time to connect and disconnect the power source to the rotor shaft.

The test method of the present invention utilizes a relatively low current to commutate a rotor for a single revolution so that a motor having excessive binding between the rotor and the stator, for example, or high roller bearing friction will not turn. After a single revolution of the rotor at the low current level and at a low velocity, if the rotor does not have excessive friction, the motor is accelerated at a very low constant rate by commutation. Then, when the rotor reaches a final predetermined velocity substantially greater than the low velocity, commutation is stopped but at least one phase of the stepping motor has a current flow therethrough.

When commutation is stopped, a rotor of an acceptable motor would have sufficient kinetic energy to continue to turn even though there is no commutation. Because of the presence of the current in at least one phase of the stepping motor, this turning would generate an AC back electromotive force (EMF) signal in the energized phase.

Since the motor with excessive friction or a phase short circuit will not be rotating, there will be no appreciable AC back EMF signal in the energized phase. This indicates a defective motor.

Additionally, if the motor is acceptable, the method of the present invention counts the elapsed time from when commutation is stopped until the acceptable motor coasts to a stop. This elapsed time can be utilized, along with the elapsed time of other acceptable motors, to determine the degree of friction of each stepping motor.

An object of this invention is to provide a method of testing a stepping motor to automatically determine whether it has excessive friction or a winding short.

Another object of this invention is to provide a method for testing a variable reluctance stepping motor to automatically determine whether it has excessive friction or a winding short.

A further object of this invention is to provide a method of testing a stepping motor in which the relative degree of friction between acceptable motors is ascertained.

The foregoing and other objects, features, and advantages of the invention will be apparent from the following more particular description of the preferred embodiment of the invention as illustrated in the accompanying drawings.

DETAILED DESCRIPTION

Figure 1:
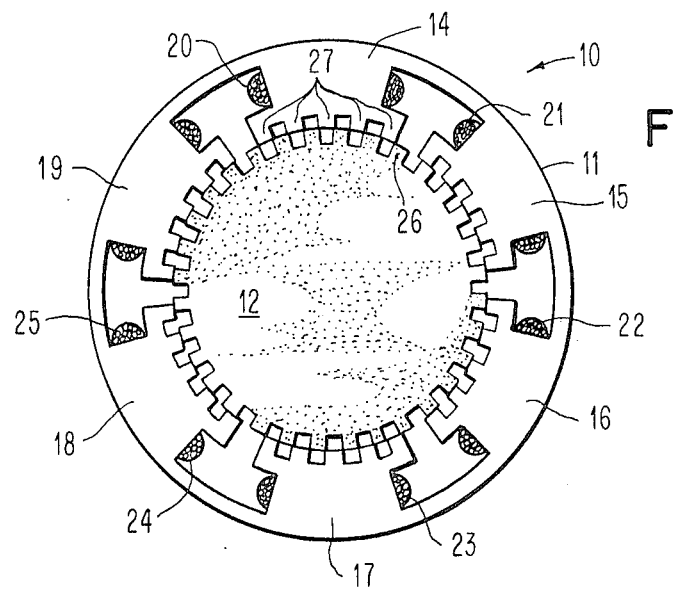
FIG. 1 is a schematic cross sectional view of a variable reluctance stepping motor that is to be tested by the method of the present invention.

Referring to the drawings and particularly FIG. 1, there is shown a three-phase, variable reluctance, 96-step per revolution stepping motor 10. The stepping motor 10 includes a stator assembly 11 and a rotor 12. The stator assembly 11 has six poles 14, 15, 16, 17, 18, and 19.

Each of the poles 14, 15, 16, 17, 18, and 19 includes a winding 20, 21, 22, 23, 24, and 25, respectively. The windings of diametrically disposed poles are connected in series to form the three-phase motor 10. Thus, the winding 20 of the pole 14 is in series with the winding 23 of the pole 17 to constitute phase A, the winding 21 of the pole 15 is in series with the winding 24 of the pole 18 to form phase B, and the winding 22 of the pole 16 is in series with the winding 25 of the pole 19 to constitute phase C. Accordingly, there are two poles per phase.

With the motor 10 being a 96-step per revolution stepping motor, the rotor 12 has thirty-two teeth 26 while there are five teeth 27 associated with each of the poles 14-19. The product of the number of the teeth 26 in the rotor 12 and the number of phases is the number of steps per revolution of the motor 10. With there being three phases and the rotor 12 having thirty-two of the teeth 26, there are ninety-six steps per revolution of the rotor 12.

The motor 10 is rotated by commutating the rotor 12 through applying current to two of the three phases at any time and in sequence. For example, current would initially be supplied to the windings 20 and 23 and the windings 21 and 24 and then removed from the windings 20 and 23 and applied to the windings 22 and 25 after the motor 10 has advanced one step.

Figure 2:
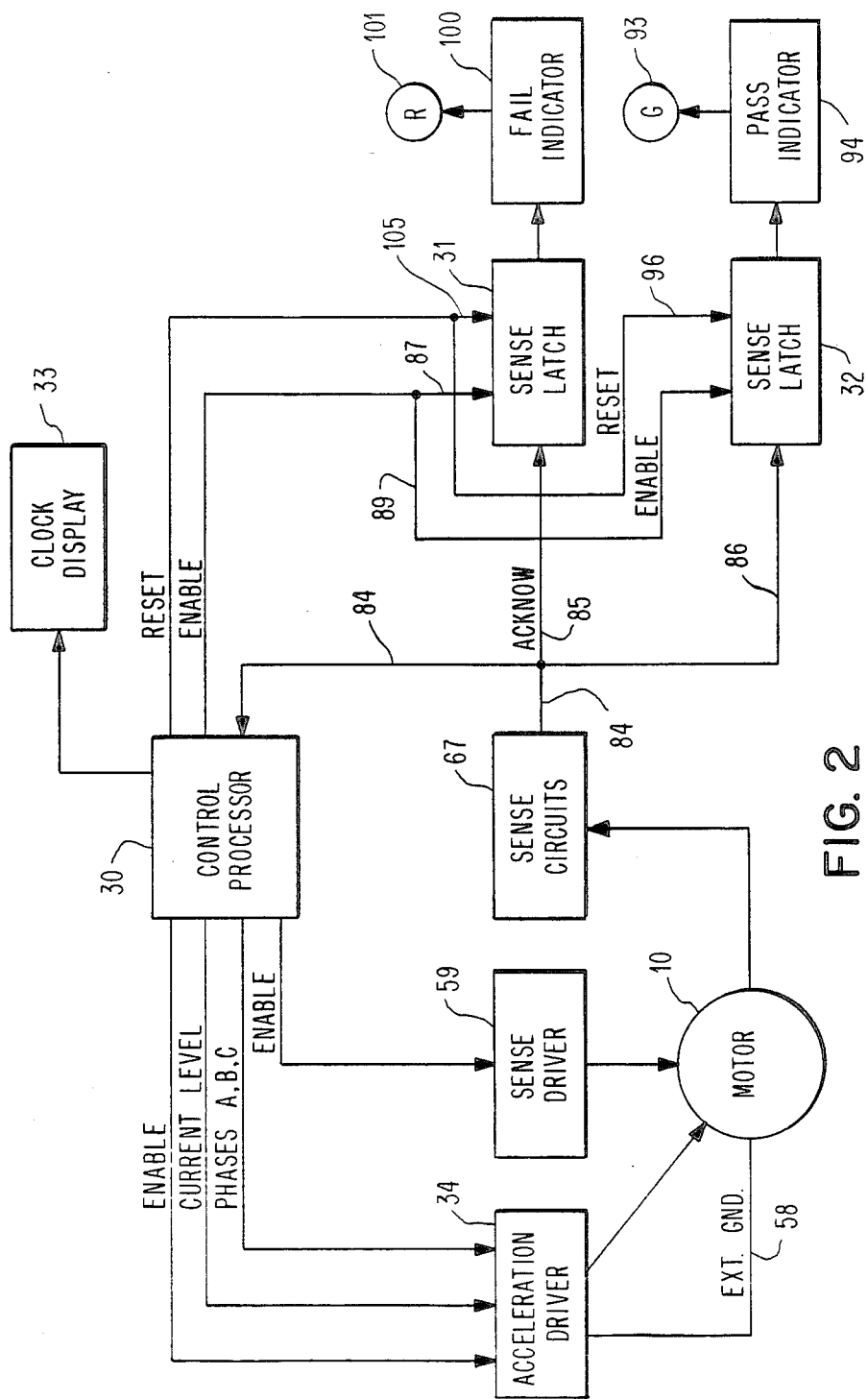
FIG. 2 is a schematic block diagram showing the functional relationship of an apparatus for carrying out the test method of the present invention.

The testing of the stepping motor 10 is under control of a control processor 30 (see FIG. 2). One suitable example of the control processor 30 is an 8085 microprocessor. Any other suitable microprocessor may be employed.

When a test of the motor 10 is to begin, the control processor 30 provides a low reset signal to reset sense latches 31 and 32 and a clock display 33. The control processor 30 also supplies signals to an acceleration driver 34.

Figure 5:
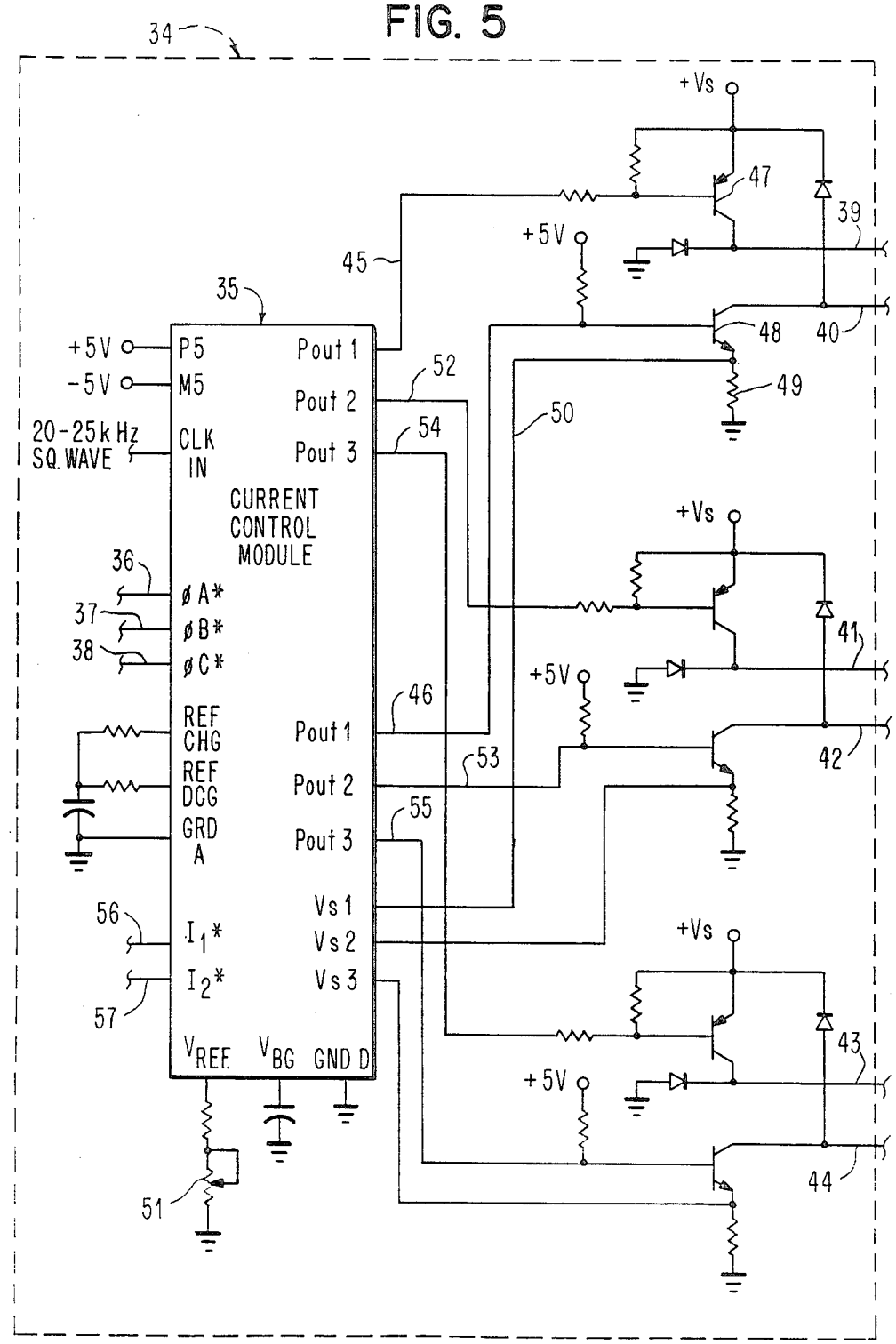
FIG. 5 is a schematic block diagram of an acceleration driver utilized in determining whether a stepping motor is acceptable.
Figure 6:
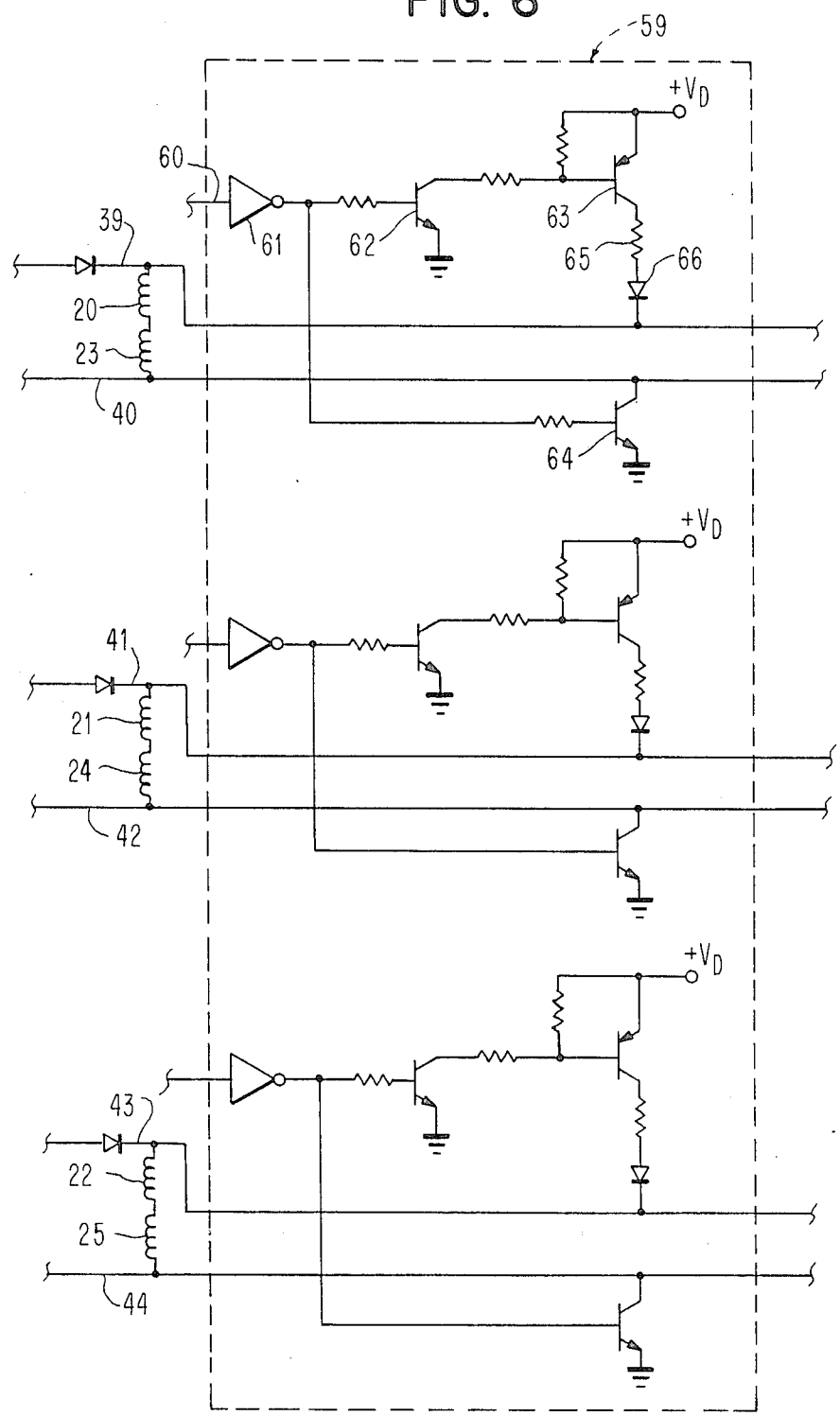
FIG. 6 is a schematic block diagram of a sense driver utilized in determining whether a stepping motor is acceptable.

The acceleration driver 34 includes a current control module 35 (see FIG. 5) receiving signals over lines 36, 37, and 38 from the control processor 30 (see FIG. 2) to enable a constant current to be supplied to the windings 20-25 (see FIG. 6). One suitable example of the current control module 35 (see FIG. 5) is an IBM integrated circuit, part No. 8247571.

The signal on the line 36 controls current flow from the acceleration driver 34 by lines 39 and 40 to the windings 20 (see FIG. 6) and 23, which comprise phase A. The signal on the line 37 (see FIG. 5) controls current flow from the acceleration driver 34 by lines 41 and 42 to the windings 21 (see FIG. 6) and 24, which form phase B. The signal on the line 38 (see FIG. 5) controls current flow from the acceleration driver 34 by lines 43 and 44 to the windings 22 (see FIG. 6) and 25, which constitute phase C.

When the line 36 (see FIG. 5) has a low signal thereon, the current control module 35 supplies signals over lines 45 and 46. The line 45 is connected to the base of a PNP transistor 47, which is a PNP TIP116. The line 46 supplies a signal to the base of an NPN transistor 48, which is an NPN TIP111.

The current control module 35 compares the voltage developed at a resistor 49 and returned to the current control module 35 by a line 50 with a $V_{REF}$ voltage. The $V_{REF}$ voltage is preset at the current control module 35 through adjusting a potentiometer 51. The potentiometer 51 is set initially through using a current meter to ascertain when one specific level of current flows through the windings 20 (see FIG. 6) and 23.

The current control module 35 (see FIG. 5) has its circuits compare the voltage on the line 50 with the $V_{REF}$ voltage. The current control module 35 has active and passive circuit components for developing a current chopping characteristic and comparator circuits to maintain the controlled current value in the windings 20 (see FIG. 6) and 23.

The current control module 35 (see FIG. 5) requires a 20-25 kHz square wave signal for the chopper frequency as a clock input. The low voltages and the passive components added to the current control module 35 complete the acceleration driver 34.

When a low signal is supplied over the line 37, the current control module 35 supplies signals over lines 52 and 53 to cause a constant current to be supplied to the windings 21 (see FIG. 6) and 24 in the same manner as described for the windings 20 and 23. When the line 38 (see FIG. 5) has a low signal, the current control module 35 supplies signals over lines 54 and 55 to cause a constant current to be supplied to the windings 22 (see FIG. 6) and 25 in the same manner as described for the windings 20 and 23.

The level of the current to be supplied to the windings 20-25 is controlled by the signals from the control processor 30 (see FIG. 2) over lines 56 (see FIG. 5) and 57 to the current control module 35. The logic within the current control module 35 determines the level of the current supplied to the windings 20-25 (see FIG. 6) in accordance with the signals on the lines 56 (see FIG. 5) and 57 to the current control module 35.

When there is a high logic signal on the line 56 and a low logic signal on the line 57, a high level of current is produced in the windings 20-25 (see FIG. 6). When the logic signal on the line 56 (see FIG. 5) is low and the logic signal on the line 57 is high, a low level current is produced in the windings 20-25 (see FIG. 6). When both of the lines 56 (see FIG. 5) and 57 have a high logic signal, no current is produced in the windings 20-25 (see FIG. 6).

The acceleration driver 34 (see FIG. 2) is turned on by the control processor 30 to produce a current at a high level of approximately 120 milliamps. The high level current is applied from the acceleration driver 34 to commutate the windings 20-25 (see FIG. 1) of the stator assembly 11. The commutation of the windings 20-25 is controlled by signals supplied from the control processor 30 (see FIG. 2) over the lines 36-38 (see FIG. 5) to the acceleration driver 34.

Figure 3:
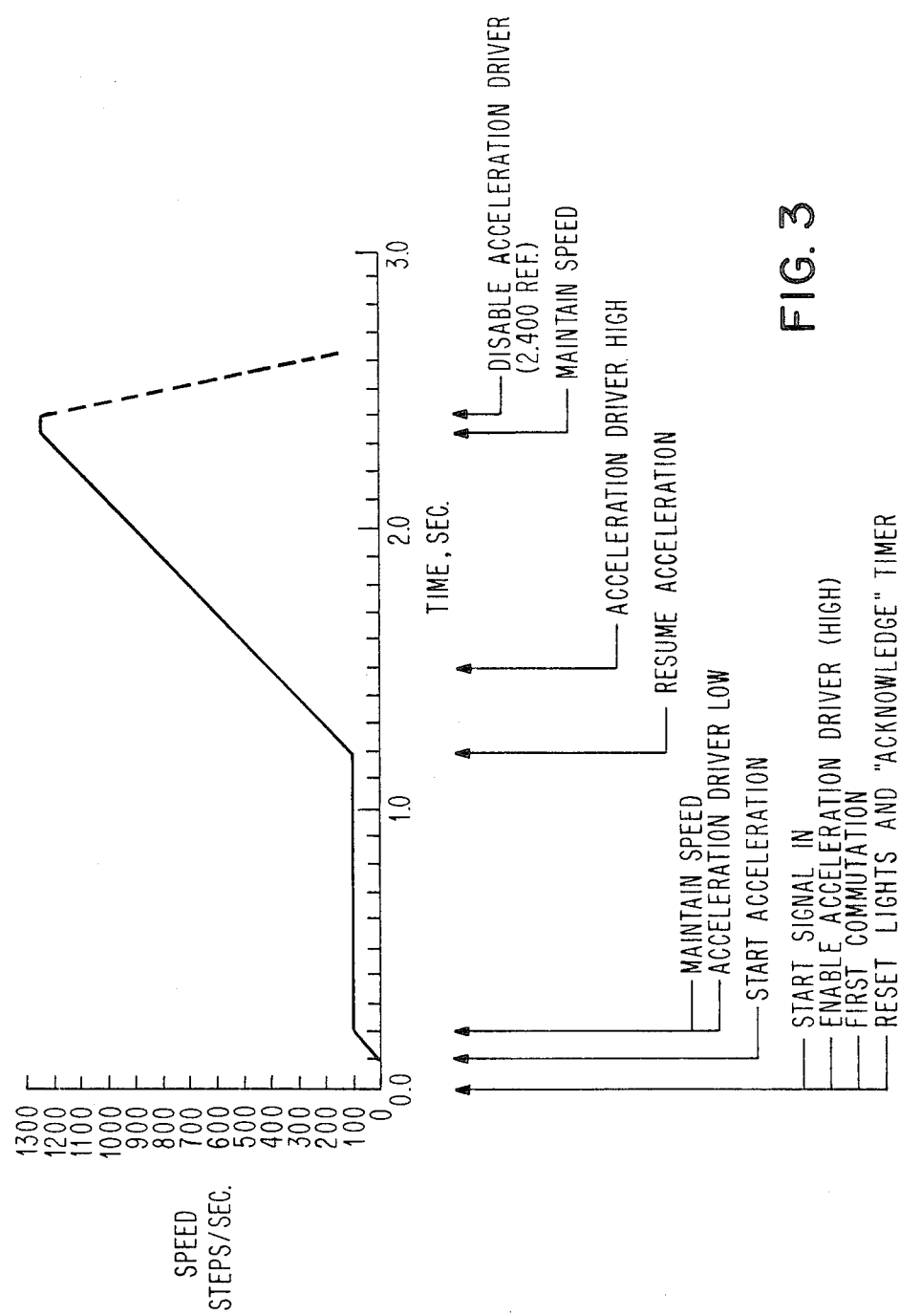
FIG. 3 is a schematic diagram showing the relationship of the velocity of the rotor including its acceleration to time during a test.

The high level current is applied for 100 milliseconds to break stiction, which is friction that must be broken to start rotation of the rotor 12 (see FIG. 1). This time period is shown in FIG. 3.

During the time that the high level current is applied by the acceleration driver 34 (see FIG. 2) to the motor 10, which has an external ground connection 58 to the acceleration driver 34, the high level current is applied to one or two of the three phases initially depending on whether one or two phases is energized at all times. Then, there is commutation under control of the control processor 30 through the lines 36-38 (see FIG. 5) to cause energization of the next phase.

With the elapsed 100 milliseconds, the control processor 30 (see FIG. 2) causes commutation of the windings 20-25 (see FIG. 1) of the stator assembly 11 to accelerate the rotor 12 from rest to a velocity of approximately 95 steps per second at a constant acceleration rate of 1,000 steps per second per second while maintaining the high level current. This acceleration occurs for approximately 100 milliseconds as shown in FIG. 3.

When the rotor 12 (see FIG. 1) is rotating at the constant velocity of approximately 95 steps per second, the acceleration driver 34 (see FIG. 2) has its current reduced to a low level of approximately 80 milliamps by the control processor 30. The motor 10 is rotated 95 steps at the constant velocity. Thus, the control processor 30 controls commutation of the windings 20-25 (see FIG. 1). As shown in FIG. 3, this takes approximately one second for the single revolution of the rotor 12 (see FIG. 1).

The low level current of 80 milliamps is sufficiently low that the rotor 12 will not rotate if there is any interference between the rotor 12 and the stator assembly 11 or the roller bearings supporting the ends of the shaft of the rotor 12 have a relatively high friction. Thus, if this low current level does not cause the rotor 12 to rotate because of the excessive friction creating a drag, the rotor 12 will not rotate during the remainder of the test.

When the single revolution of the rotor 12 has been completed, the control processor 30 (see FIG. 2) resumes acceleration of the rotor 12 (see FIG. 1) at a constant acceleration rate of 1,000 steps per second per second to increase the velocity of the rotor 12 from approximately 95 steps per second to 1,250 steps per second. During this acceleration, the control processor 30 (see FIG. 2) reinstates the high level current from the acceleration driver 34 when the velocity of the rotor 12 (see FIG. 1) reaches 400 steps per second. Thus, at this time, the current level of the acceleration driver 34 (see FIG. 2) is approximately 120 milliamps. This increase in the level of the current from the driver 34 occurs when the speed of the rotor 12 (see FIG. 1) exceeds its "pull in" rate so as to prevent loss of synchronism.

When the motor 10 reaches the velocity of 1,250 steps per second, the control processor 30 (see FIG. 2) stops acceleration. However, commutation continues for sixty-three additional steps of the motor 10 to stabilize the motor 10 at the final velocity of 1,250 steps per second.

When the speed of the rotor 12 (see FIG. 1) is stabilized at the completion of sixty-three steps following acceleration, the acceleration driver 34 (see FIG. 2) is turned off by the control processor 30. This is at about 2.4 seconds. When the driver 34 is turned off, the clock display 33, which is an ACKNOWLEDGE timer within the control processor 30, is started provided that the rotor 12 (see FIG. 1) has been rotating. The clock display 33 (see FIG. 2) displays the elapsed time, which is identified in FIG. 4 as the ACKNOWLEDGE signal drop time.

Figure 4:
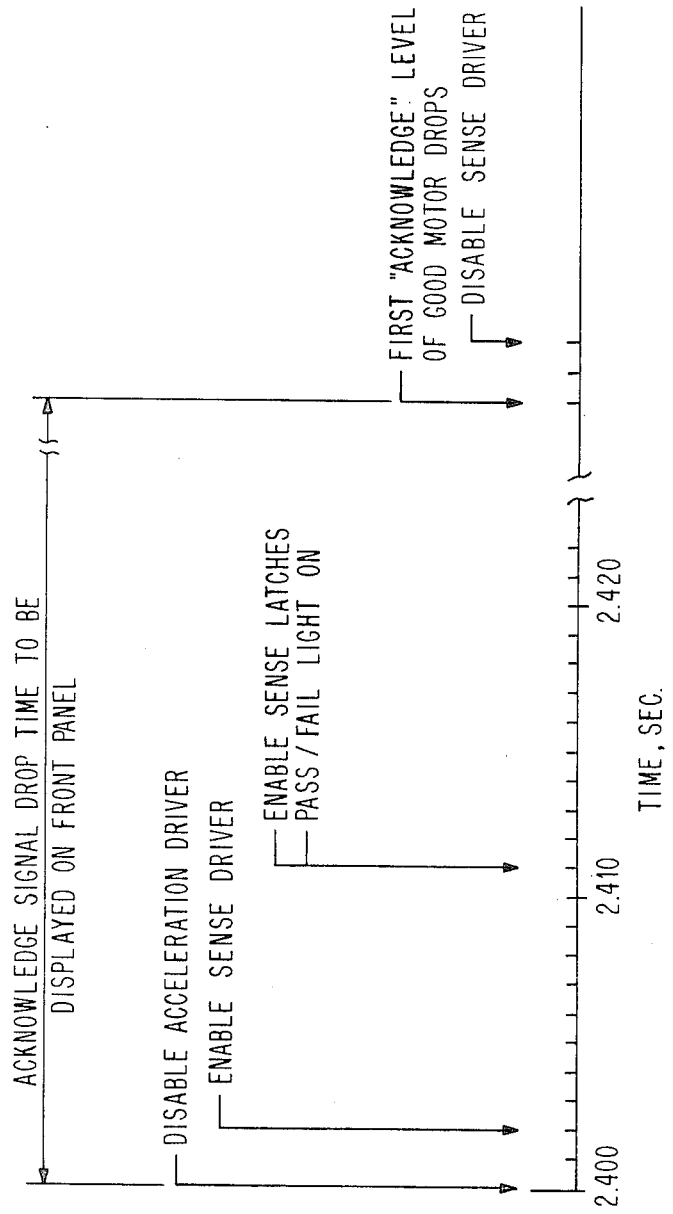
FIG. 4 is a schematic diagram showing various occurrences during the test from stopping of the acceleration of a rotor of a stepping motor being tested until completion of testing.

Two milliseconds after the acceleration driver 34 (see FIG. 2) is turned off by the control processor 30, a sense driver 59 is turned on by a signal from the control processor 30 as shown in FIG. 4. The sense driver 59 (see FIG. 6) includes the same circuit for each of the three phases.

The portion of the sense driver 59 used for the windings 20 and 23, which comprise phase A, includes a line 60 from the control processor 30 (see FIG. 2) to an inverter 61 (see FIG. 6), which is a 7404 inverter. The portion of the sense driver 59 connected to the windings 20 and 23 also includes an NPN transistor 62, which is a 2N2222 transistor, and a PNP transistor 63, which is a TIP116 transistor. There also is an NPN transistor 64, which is a TIP111 transistor.

When the acceleration driver 34 (see FIG. 2) is turned off, the sense driver 59 is energized by a low logic command signal from the control processor 30 over the line 60 (see FIG. 6). This produces a high at the output of the inverter 61 to cause the transistor 62 to be active. As a result, the transistor 63 is activated to allow a direct current to flow through a resistor 65 and a diode 66 to the windings 20 and 23. The current path is completed from the windings 20 and 23 through the transistor 64 to ground.

As shown in FIG. 4, the sense latches 31 (see FIG. 2) and 32 are enabled nine milliseconds after the sense driver 59 is energized. This allows an ACKNOWLEDGE signal to be latched in each of the sense latches 31 and 32. The ACKNOWLEDGE signal is latched until the sense latches 31 and 32 are reset at the start of the next test cycle.

The sense driver 59 produces a constant direct current. This constant direct current is applied simultaneously to each of the phases of the motor 10 although it is only necessary for one of the phases of the motor 10 to have the current applied thereto. However, the supply of the constant direct current to each of the three phases of the motor 10 is more desirable since it results in a more reliable signal after the acceleration driver 34 has been inactivated.

The presence of this current at a low level of approximately 80 milliamps produces a flux that creates a back EMF during coasting of the rotor 12 (see FIG. 1) to a stop from the time that the acceleration driver 34 (see FIG. 2) was inactivated. The presence or absence of the back EMF before the rotor 12 (see FIG. 1) dissipates its kinetic energy is sensed or detected by sense circuits 67 (see FIG. 2).

Figure 7:
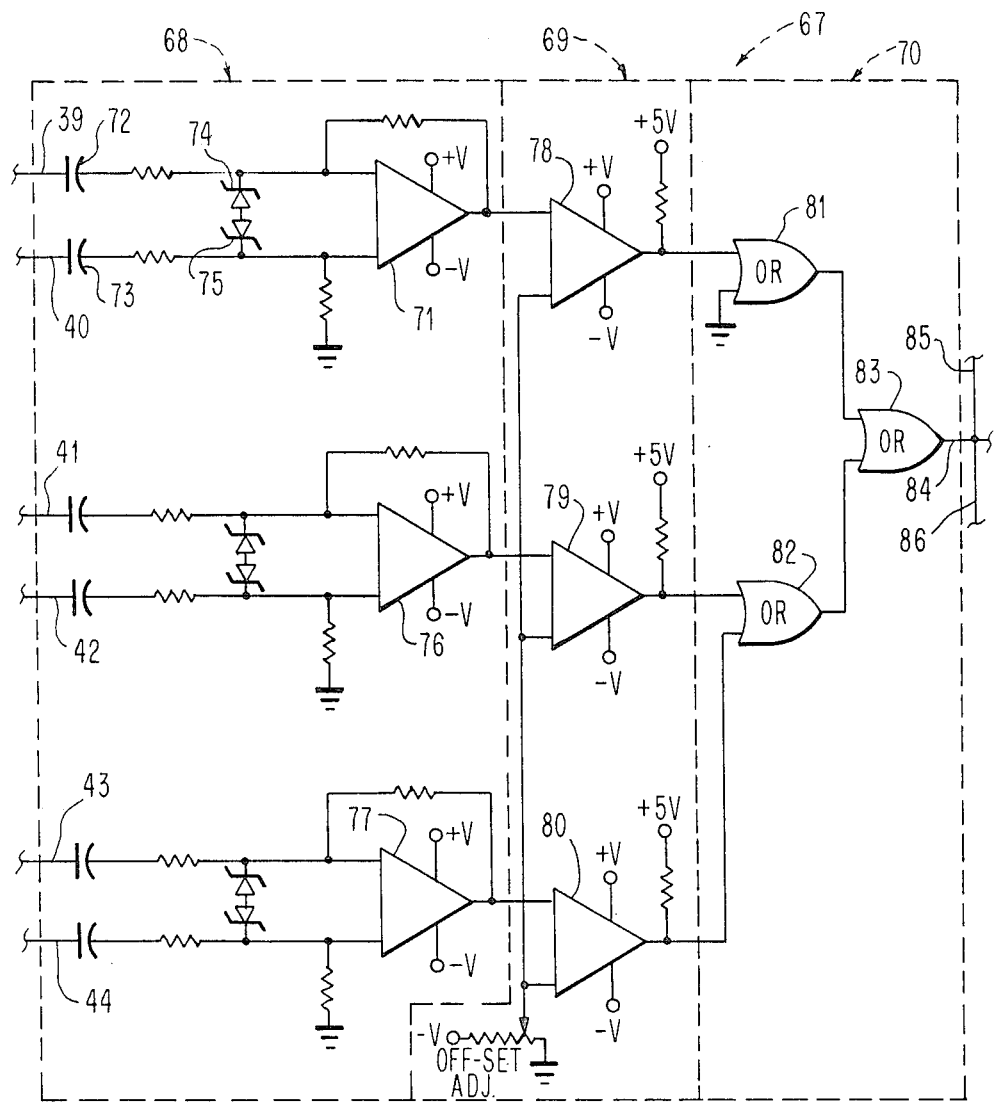
FIG. 7 is a schematic block diagram of sense circuits utilized in determining whether a stepping motor is acceptable.

As shown in FIG. 7, the sense circuits 67 include AC coupled amplifiers 68, zero-crossing detectors 69, and logic "OR" circuits 70. The AC coupled amplifiers 68 for the phase A include an operational amplifier 71, which is an LM747 operational amplifier, AC coupled through capacitors 72 and 73 to the windings 20 (see FIG. 6) and 23. The AC coupled amplifiers 68 (see FIG. 7) for the windings 20 (see FIG. 6) and 23 include a pair of back-to-back Zener diodes 74 (see FIG. 7) and 75, which function as a protective clamp to remove overload signals to protect the operational amplifier 71.

An operational amplifier 76, which is the same as the operational amplifier 71, is AC coupled to the windings 21 (see FIG. 6) and 24 in the same manner as the operational amplifier 71 (see FIG. 7) is AC coupled to the windings 20 (see FIG. 6) and 23. An operational amplifier 77 (see FIG. 7), which is the same as the operational amplifier 71, is AC coupled to the windings 22 (see FIG. 6) and 25 in the same manner as the operational amplifier 71 (see FIG. 7) is AC coupled to the windings 20 (see FIG. 6) and 23.

Figure 10:
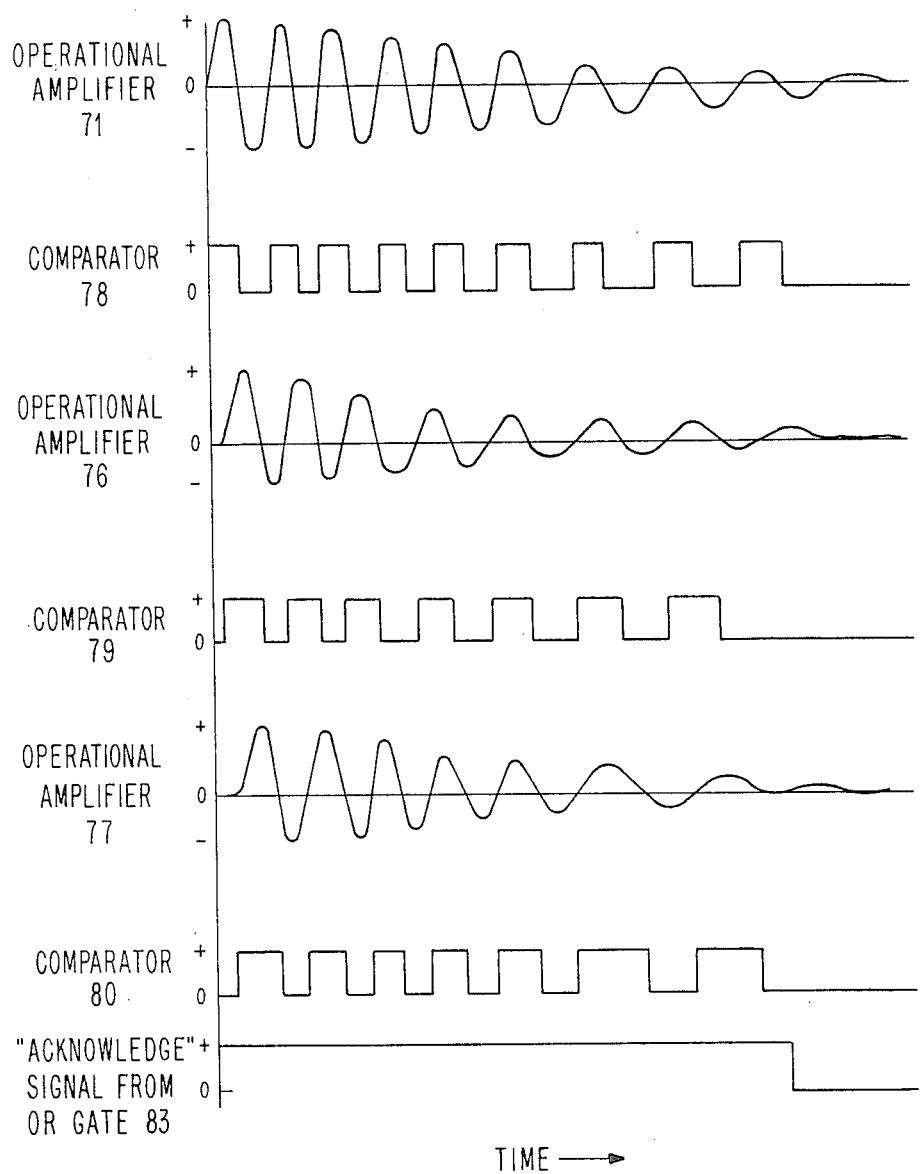
FIG. 10 is a timing diagram of outputs of portions of the sense circuits of FIG. 7.

The signals from the outputs of the operational amplifiers 71, 76, and 77 are shown in FIG. 10. Each of these is electrically spaced 120° from the other two.

The outputs from the AC coupled amplifiers 68 (see FIG. 7) are supplied to the zero-crossing detectors 69. Thus, the output from the operational amplifier 71 is supplied to a voltage comparator 78 of the zero-crossing detectors 69, the output of the operational amplifier 76 is supplied to a voltage comparator 79 of the zero-crossing detectors 69, and the output from the operational amplifier 77 is supplied to a voltage comparator 80 of the zero-crossing detectors 69. The outputs of the comparators 78-80, which may be LM339 voltage comparators, for example, are shown in FIG. 10.

The output of the comparator 78 (see FIG. 7) is supplied as one input to an OR gate 81 of the logic "OR" circuits 70. The other input to the OR gate 81 is grounded. The outputs of the voltage comparators 79 and 80 are the two inputs to an OR gate 82 of the logic "OR" circuits 70.

The outputs of the OR gates 81 and 82 are the two inputs to an OR gate 83, which has the ACKNOWLEDGE signal as its output on a line 84. The OR gates 81-83 may be 7432 OR gates, for example.

As shown in FIG. 10, the comparators 78-80 provide output pulses in accordance with when the voltages from the operational amplifiers 71, 76, and 77 cross the zero voltage line. That is, a declining voltage causes the output of each of the comparators 78, 79, and 80 to go low. When the voltage increases beyond zero from each of the operational amplifiers 71, 76, and 77, the output of the comparators 78, 79, and 80, respectively, goes up.

Since the output of one of the three comparators 78-80 (see FIG. 7) is up until the voltage output from each of the operational amplifiers 71, 76, and 77 becomes less than the comparing voltage in the comparators 78, 79, and 80, respectively, to which the operational amplifiers 71, 76, and 77 are connected, the ACKNOWLEDGE signal from the OR gate 83 will remain up until none of the comparators 78-80 produces a high pulse.

Figure 8:
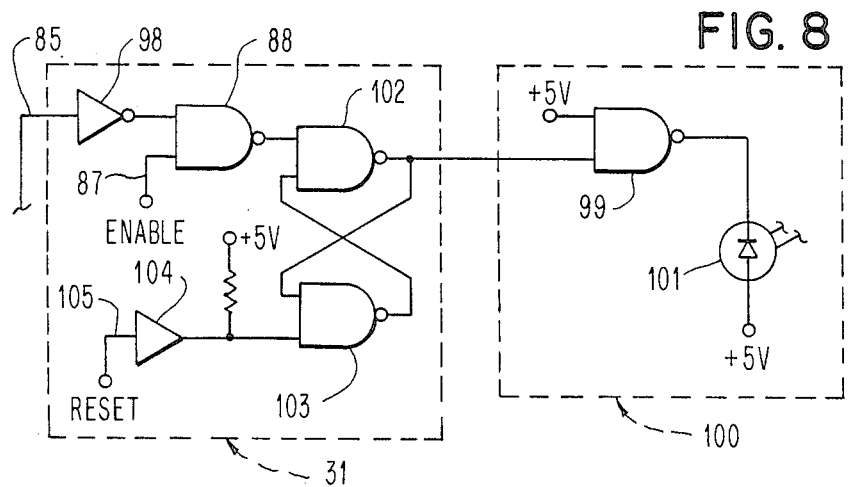
FIG. 8 is a schematic block diagram of a sense latch and a fail indicator circuit.

Thus, if the rotor 12 (see FIG. 1) is rotating so that a back EMF is created, a high ACKNOWLEDGE signal will be produced from the sense circuits 67 (see FIG. 7). This signal is supplied over a line 84 and a line 85 (see FIG. 8) to the sense latch 31 and over the line 84 (see FIG. 7) and a line 86 (see FIG. 9) to the sense latch 32.

The line 84 (see FIG. 7) also is connected to the control processor 30 (see FIG. 2).

As shown in FIG. 4, the sense latches 31 (see FIG. 2) and 32 are enabled nine milliseconds after the sense driver 59 is turned on. The ENABLE signal from the control processor 30 is supplied over a line 87 (see FIG. 8) to a NAND gate 88 of the sense latch 31 and over a line 89 (see FIG. 9) to a NAND gate 90 of the sense latch 32.

The other input to the NAND gate 90 of the sense latch 32 is the ACKNOWLEDGE signal on the line 86 so that a high ACKNOWLEDGE signal from the sense circuits 67 (see FIG. 7) will produce a high at the output of a NAND gate 91 (see FIG. 9) for supply as one input to a NAND gate 92. The NAND gate 92 has a high voltage as its other input so that it has a low output when the ACKNOWLEDGE signal is high. As a result, a green LED 93 of a pass indicator circuit 94 will be energized.

The ENABLE signal is up for only a short period of time. However, the LED 93 remains energized if the ACKNOWLEDGE signal is high because of the cooperation between the NAND gate 91 and a NAND gate 95. The NAND gates 91 and 95 comprise an R-S type memory latch circuit. The LED 93 is turned off only when a low RESET signal is supplied over a line 96 from the control processor 30 (see FIG. 2) to a buffer 97 (see FIG. 9).

If the ACKNOWLEDGE signal is low because the rotor 12 (see FIG. 1) of the motor 10 is not rotating, this low on the line 85 (see FIG. 8) is converted by an inverter 98, which may be a 7404 inverter, for example, of the sense latch 31 so that the sense latch 31, which is the same as the sense latch 32 (see FIG. 9) except for the inverter 98 (see FIG. 8), will supply a high to a NAND gate 99 of a fail indicator circuit 100. As a result, a red LED 101 is turned on to indicate that the motor 10 (see FIG. 1) is not satisfactory.

Figure 9:
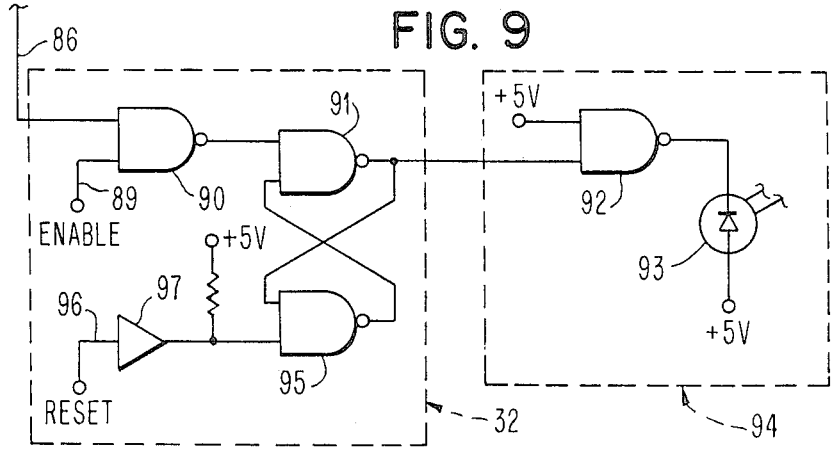
FIG. 9 is a schematic block diagram of a sense latch and a pass indicator circuit.

The sense latch 31 (see FIG. 8) also includes NAND gates 102 and 103, which correspond to the NAND gates 91 (see FIG. 9) and 95, respectively, of the sense latch 32, and a buffer 104 (see FIG. 8), which corresponds to the buffer 97 (see FIG. 9). The NAND gates 102 (see FIG. 8) and 103 and the buffer 104 cooperate with each other in the same manner as the NAND gates 91 (see FIG. 9) and 95 and the buffer 97. Thus, the red LED 101 (see FIG. 8) will remain energized until a low RESET signal is supplied to the buffer 104 over a line 105 from the control processor 30 (see FIG. 2).

One suitable example of each of the NAND gates 88 (see FIG. 8), 90 (see FIG. 9), 91, 92, 95, 99 (see FIG. 8), 102, and 103 is a 7400 NAND gate. One suitable example of each of the buffers 97 (see FIG. 9) and 104 (see FIG. 8) is a 7407 buffer.

When a high ACKNOWLEDGE signal from the sense circuits 67 (see FIG. 2) first goes low, this causes the clock display 33 to be stopped. For a good motor, the elapsed time on the clock display 33 will enable a comparison of the degree of friction between good motors. With a bad motor, the clock display 33 will have no count because of the absence of the rotor 12 (see FIG. 1) rotating to create any back EMF.

After the high ACKNOWLEDGE signal first goes low for a good motor, the clock display 33 (see FIG. 2) is stopped. As shown in FIG. 4, the sense driver 59 (see FIG. 2) is disabled by the control processor 30 two milliseconds after the high ACKNOWLEDGE signal first goes low.

If desired, the functions of sense and acceleration could be integrated into a single driver. However, if this occurs, it is necessary that the functions of the acceleration driver 34 be satisfied and stressed.

While the acceleration driver 34 has been described as providing two different levels of current, it should be understood that the method of the present invention will function satisfactorily with only low level current. Thus, it is not a requisite that there be two levels of current supplied by the acceleration driver 34.

It should be understood that the sensitivity of the current level in the windings 20-25 (see FIG. 1) during the initial acceleration of the rotor 12 must be controlled. If the current level is too low, all motors might be rejected because insufficient torque would be produced to overcome normal bearing friction and hysteresis. If the current level is too high, only motors with a relatively high drag torque would be rejected whereby undesirable motors would be accepted.

While the present invention has shown and described the motor 10 as being a variable reluctance stepping motor, it should be understood that the test method of the present invention could be utilized with a permanent magnet stepping motor or a hybrid stepping motor. In testing either the permanent magnet or the hybrid motor, no current would be supplied during sensing. This is because each of the permanent magnet motor and the hybrid motor produces flux without a current so that rotation of the permanent magnet motor or the hybrid motor would produce a back EMF without a current. Therefore, the sense driver 59 (see FIG. 2) supplies current to have a variable reluctance motor function in the same manner as a permanent magnet motor.

An advantage of this invention is that there is relatively quick testing of a stepping motor for excessive drag or a winding short. Another advantage of this invention is that manual checking of a stepping motor for excessive drag is avoided. A further advantage of this invention is that there is automatic testing of a stepping motor. Still another advantage of this invention is that it is a low cost method of testing a stepping motor for excessive drag or a winding short. A still further advantage of this invention is that the degree of friction in a good stepping motor relative to other good stepping motors can be determined. Yet another advantage of this invention is that no mechanical force has to be applied to the rotor shaft to test for excessive drag.

While the invention has been particularly shown and described with reference to a preferred embodiment thereof, it will be understood by those skilled in the art that the foregoing and other changes in the form and details may be made therein without departing from the spirit and scope of the invention.

What is claimed is:

1. A method of testing a stepping motor having a plurality of windings and a rotor to determine the presence of friction in excess of a predetermined amount or a shorted winding including:
   applying a predetermined current to the windings of the motor;
   commutating the motor windings to effect, with the predetermined current, acceleration of the rotor of an acceptable motor to a final predetermined velocity;
   removing the predetermined current after a selected period of time sufficient for the rotor of an acceptable motor to reach the final predetermined velocity;
   and sensing the presence or absence of a back electromotive force after the predetermined current is removed, the presence of the back electromotive force indicating an acceptable motor and the absence of the back electromotive force indicating friction in excess of the predetermined amount or a winding short.

2. The method according to claim 1 including determining the elapsed time between the removal of the predetermined current and the absence of a back electromotive force if a back electromotive force was present when the predetermined current was removed.

3. The method according to claim 2 including displaying the elapsed time to enable a comparison of the degree of friction between acceptable tested motors.

4. The method according to claim 3 including applying a regulated current as the predetermined current.

5. The method according to claim 4 including applying a direct current to at least one winding upon removal of the regulated current to allow sensing of the presence or absence of a back electromotive force.

6. The method according to claim 5 including accelerating the rotor at a constant acceleration.

7. The method according to claim 6 including enabling a latching circuit for sensing the presence or absence of a back electromotive force.

8. The method according to claim 7 including:
   applying the predetermined current at a first level to initiate and accelerate a rotor of an acceptable motor from start until it reaches a first predetermined velocity;
   maintaining the rotor at the first predetermined velocity for one revolution of the rotor while applying the predetermined current at a second level lower than the first level;
   maintaining the predetermined current at the second level after the one revolution of the rotor while accelerating the rotor of an acceptable motor from the first predetermined velocity to a final predetermined velocity;
   and applying the predetermined current at the first level during acceleration of the rotor of an acceptable motor to the final predetermined velocity when the rotor of an acceptable motor reaches a selected velocity between the first predetermined velocity and the final predetermined velocity.

9. The method according to claim 1 including applying a regulated current as the predetermined current.

10. The method according to claim 9 including applying a direct current to at least one winding upon removal of the regulated current to allow sensing of the presence or absence of a back electromotive force.

11. The method according to claim 10 including accelerating the rotor at a constant acceleration.

12. The method according to claim 11 including enabling a latching circuit for sensing the presence or absence of a back electromotive force.

13. The method according to claim 12 including:
   applying the predetermined current at a first level to initiate and accelerate a rotor of an acceptable motor from start until it reaches a first predetermined velocity;
   maintaining the rotor at the first predetermined velocity for one revolution of the rotor while applying the predetermined current at a second level less than the first level;

maintaining the predetermined current at the second level after the one revolution of the rotor while accelerating the rotor of an acceptable motor from the first predetermined velocity to a final predetermined velocity;

and applying the predetermined current at the first level during acceleration of the rotor of an acceptable motor to the final predetermined velocity when the rotor of an acceptable motor reaches a selected velocity between the first predetermined velocity and the final predetermined velocity.

14. The method according to claim 1 including applying a direct current to at least one winding upon removal of the predetermined current to allow sensing of the presence or absence of a back electromotive force.

15. The method according to claim 14 including enabling a latching circuit for sensing the presence or absence of a back electromotive force.

16. The method according to claim 15 including accelerating the rotor at a constant acceleration.

17. The method according to claim 16 including:

applying the predetermined current at a first level to initiate and accelerate a rotor of an acceptable motor from start until it reaches a first predetermined velocity;

maintaining the rotor at the first predetermined velocity for one revolution of the rotor while applying the predetermined current at a second level less than the first level;

maintaining the predetermined current at the second level after the one revolution of the rotor while accelerating the rotor of an acceptable motor from the first predetermined velocity to a final predetermined velocity;

and applying the predetermined current at the first level during acceleration of the rotor of an acceptable motor to the final predetermined velocity when the rotor of an acceptable motor reaches a selected velocity between the first predetermined velocity and the final predetermined velocity.

18. The method according to claim 1 including enabling a latching circuit for sensing the presence or absence of a back electromotive force.

19. The method according to claim 18 including accelerating the rotor at a constant acceleration.

20. The method according to claim 1 including:

applying the predetermined current at a first level to initiate and accelerate a rotor of an acceptable motor from start until it reaches a first predetermined velocity;

maintaining the rotor at the first predetermined velocity for one revolution of the rotor while applying the predetermined current at a second level less than the first level;

maintaining the predetermined current at the second level after the one revolution of the rotor while accelerating the rotor of an acceptable motor from the first predetermined velocity to a final predetermined velocity;

and applying the predetermined current at the first level during acceleration of the rotor of an acceptable motor to the final predetermined velocity when the rotor of an acceptable motor reaches a selected velocity between the first predetermined velocity and the final predetermined velocity.

* * * * *